United States Patent
Burns et al.

[11] Patent Number: 6,083,322
[45] Date of Patent: *Jul. 4, 2000

[54] MODULAR COATING FIXTURE

[75] Inventors: Steven M. Burns, Waterbury; William A. Nehez, Sr., Wallingford, both of Conn.

[73] Assignee: United Technologies Corporation, Hartford, Conn.

[ * ] Notice: This patent is subject to a terminal disclaimer.

[21] Appl. No.: 08/813,384

[22] Filed: Mar. 6, 1997

[51] Int. Cl.$^7$ .................................................. C23C 16/00
[52] U.S. Cl. ............................................................ 118/730
[58] Field of Search ...................................... 118/730, 728, 118/729; 414/223, 325; 116/715

[56] References Cited

U.S. PATENT DOCUMENTS

| | | |
|---|---|---|
| 3,993,297 | 11/1976 | Tokunaga ................................. 269/54.5 |
| 4,051,695 | 10/1977 | Phillips et al. . |
| 4,192,253 | 3/1980 | Aichert et al. . |
| 4,271,005 | 6/1981 | Wright et al. . |
| 5,112,644 | 5/1992 | Seddon et al. . |
| 5,378,284 | 1/1995 | Geisler et al. .................... 118/723 MR |
| 5,558,909 | 9/1996 | Poliquin et al. ......................... 427/251 |
| 5,565,035 | 10/1996 | Sylvestro et al. . |

*Primary Examiner*—Richard Bueker
*Assistant Examiner*—Erin Fieler
*Attorney, Agent, or Firm*—Bachman & LaPointe, P.C.

[57] ABSTRACT

The present invention relates to an apparatus for simultaneously coating a plurality of workpieces. The apparatus includes a module fixture having a plurality of bushing and spindle arrangements for supporting the workpieces to be coated. The bushing and spindle arrangements allow each workpiece to rotate about its longitudinal axis and tilt along an axis which intersects the rotational axis of the fixture. By providing such a bushing and spindle arrangement, it is possible to coat surfaces of the workpiece which are substantially perpendicular to other surfaces of the workpiece. A process for simultaneously coating the workpieces is also described. The process comprises the steps of mounting a plurality of workpieces to the fixture so that the workpieces can roll about their longitudinal axes and so that the workpieces are positioned at an angle with respect to the rotational axis of the fixture, rotating the fixture about its rotational axis so as to cause said workpieces to roll, and exposing the workpieces to a coating material as the fixture is being rotated.

40 Claims, 5 Drawing Sheets

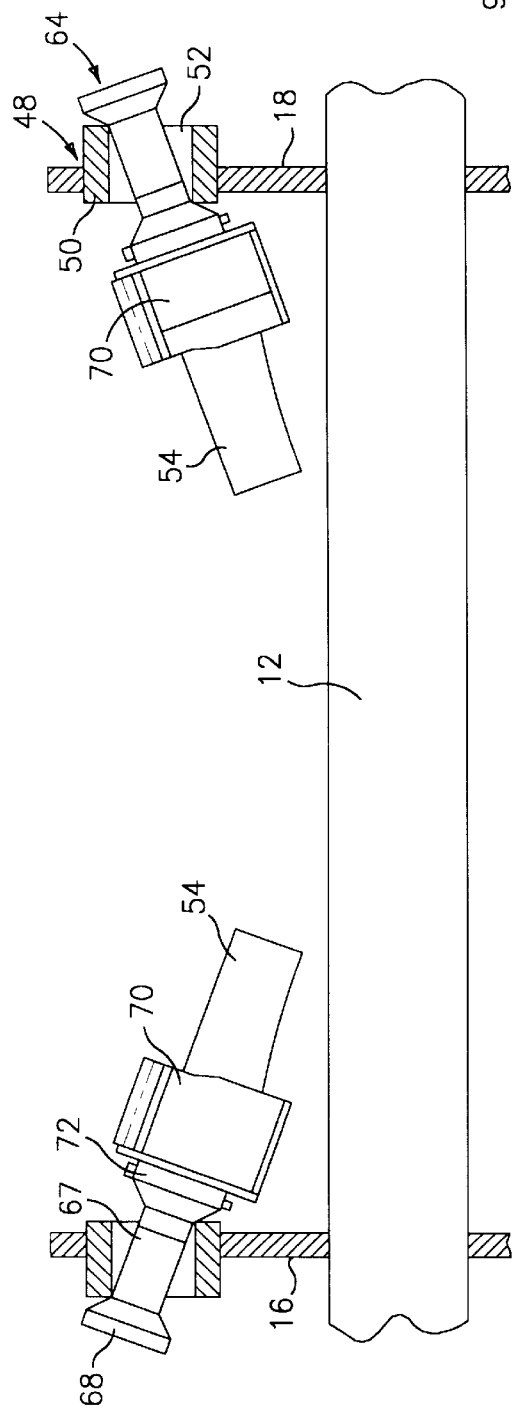
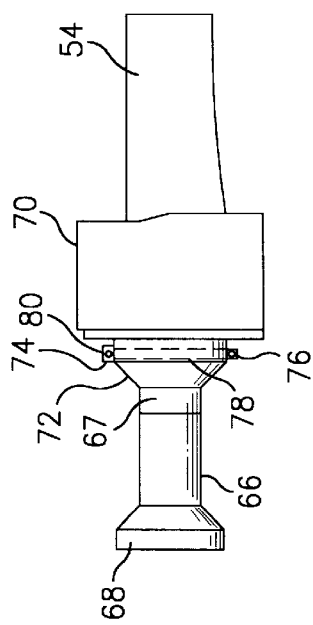
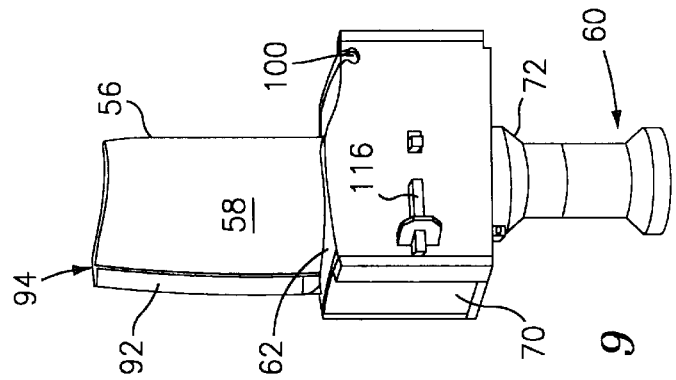

MODULAR COATING FIXTURE

BACKGROUND OF THE INVENTION

The present invention relates to a novel modular fixture to be used in an apparatus for coating workpieces and to a process for coating said workpieces. The present invention has particular utility in the coating of vanes and blades for industrial turbines and jet engines.

Vanes and blades used in industrial turbines and jet engines are typically subjected to a coating operation to improve their resistance to corrosion, thermal fatigue, and to otherwise enhance their performance. Economic concerns dictate that one must be able to simultaneously coat multiple workpieces in order to have a commercial process.

One commercial system for simultaneously coating a plurality of workpieces is shown in U.S. Pat. No. 4,192,253. In this system, a plurality of workpieces to be coated are inserted into a coating chamber and simultaneously rotated about their longitudinal axes during the coating operation. The simultaneous rotation of the workpieces about their longitudinal axes is accomplished by mounting each workpiece to the tip of a fixture whose other end is connected to a complex gear operated drive system for rotating the fixture and the individual workpieces mounted thereto. This type of system is disadvantageous for a number of reasons. For example, the system is complex and potentially troublesome from a maintenance standpoint. Still further, the costs associated with such a system are quite high. Yet, another disadvantage is the delay incurred in individually removing the coated workpieces from each of the fixtures and mounting new workpieces to be coated onto the fixtures.

More recently, it has been proposed to coat multiple workpieces at a single time using a modular fixture arrangement. This type of coating system is illustrated in copending U.S. patent application Ser. No. 08/782,398, filed on Jan. 13, 1997, to John W. Menchetti et al., entitled MODULAR COATING FIXTURE, and assigned to the Assignee of the present application.

Certain coating techniques, such as electron beam physical vapor deposition, are line of sight techniques wherein surfaces of a workpiece which are not in a line of sight with the source of the coating material will not be coated. Thus, there still remains a need for an apparatus and process which enables one to coat surfaces, such as platforms, which are perpendicular or near perpendicular to other surfaces of a workpiece to be coated.

SUMMARY OF THE INVENTION

Accordingly, it is a principal object of the present invention to provide a modular fixture which facilitates the simultaneous coating of multiple workpieces.

It is a further object of the present invention to provide a fixture as above which enables the coating of surfaces which are positioned at an angle relative to each other.

It is still a further object of the present invention to provide a fixture as above which allows a more rapid part changeover and which is economically viable.

It is yet a further object of the present invention to provide an improved method for coating workpieces such as turbine blades and vanes.

The foregoing objects are attained by the modular fixture and the process of the present invention.

In accordance with the present invention, an apparatus for coating one or more workpieces broadly comprises a modular fixture which includes a means for supporting each workpiece to be coated so as to cause each workpiece during the coating operation to simultaneously rotate about its longitudinal axis and tilt towards a source of coating material. The modular fixture includes a longitudinally extending shaft and at least one support plate attached thereto. The supporting means for each workpiece comprises a bushing arrangement within each support plate and a cooperating spindle arrangement to which the workpiece is attached. In a preferred fixture construction, a plurality of bushing arrangements are radially spaced around each support plate and a cooperating spindle arrangement is provided for each bushing arrangement. The bushing arrangement preferably comprises a hollow cylindrical sleeve having an interior bore of a desired dimension whose interior surface has been roughened. The spindle arrangement preferably comprises a pin having an enlarged end portion for contacting one end of the sleeve and a shaft portion attached to the enlarged end portion. The shaft portion has an outer diameter less than the diameter of the interior bore. This, together with the roughness of the bore, permits the workpiece attached to the spindle arrangement to be rotated about its longitudinal axis as the modular fixture is rotated about its longitudinal axis and simultaneously tilted relative to the longitudinal axis of the fixture and towards the source of the coating material.

The process of the present invention broadly comprises the steps of providing a source of coating material; attaching a workpiece to be coated to a fixture; and coating at least one surface of said workpiece by rotating said fixture and said workpiece attached thereto and simultaneously tilting said workpiece toward the source of the coating material.

Other details of the apparatus and the process of the present invention, as well as other objects and advantages attendant thereto, are set forth in the following detailed description and the accompanying drawings in which like reference numeral depict like elements.

BRIEF DESCRIPTION OF THE DRAWINGS

FIG. 5 is a side view in partial cross-section of the modular fixture of FIG. 1;

FIG. 6 is a side view of a spindle arrangement used in the modular fixture of FIG. 1;

FIG. 9 is a perspective view of a vane-type workpiece positioned within the retaining device of FIGS. 7 and 8.

DETAILED DESCRIPTION OF THE PREFERRED EMBODIMENT(S)

Figure 1:
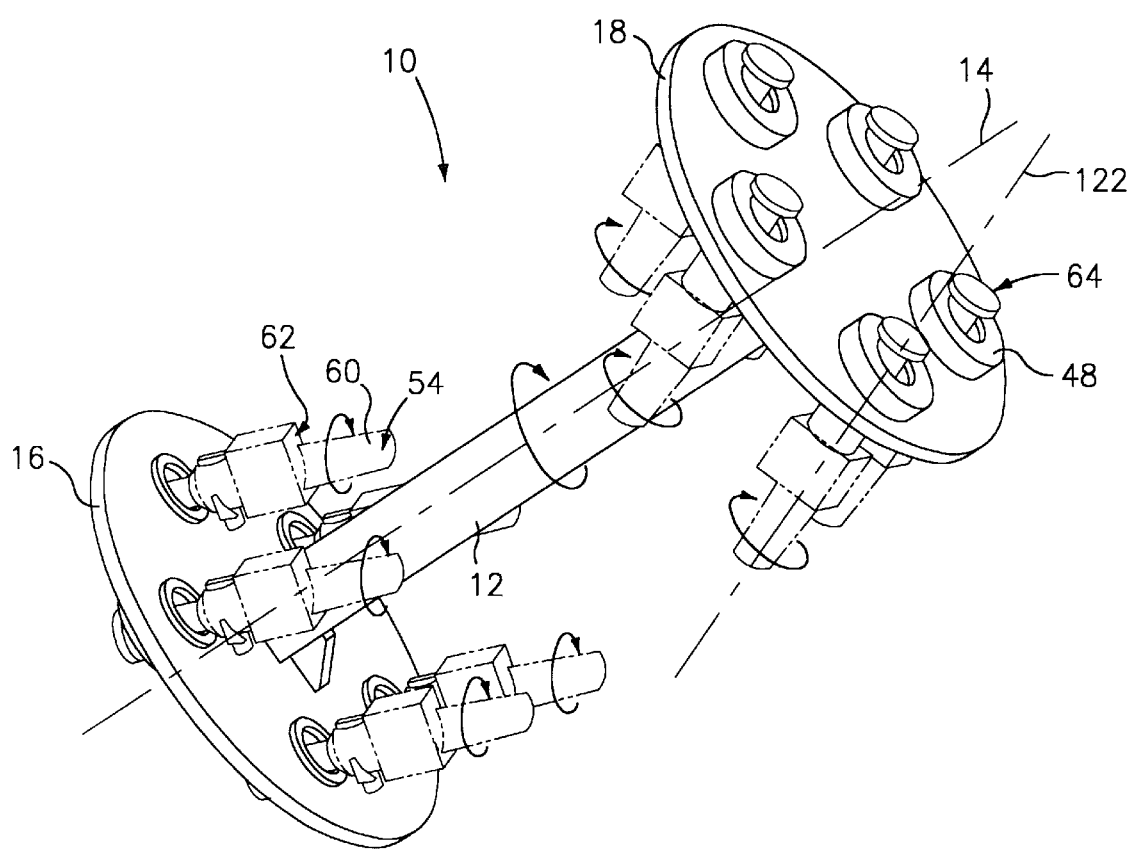
FIG. 1 is a perspective view of a modular fixture in accordance with the present invention.

Referring now to the drawings, FIG. 1 illustrates a modular coating fixture 10 in accordance with the present invention. As shown therein, the fixture 10 includes a central shaft 12 which extends in a direction parallel to the longitudinal axis 14 of the fixture 10. The fixture 10 further includes two spaced apart support plates 16 and 18 which are preferably welded to the shaft 12. If desired, the support plates 16 and 18 may be secured to the shaft 12 by a plurality of supports 20 welded to the shaft 12 at various locations about its periphery and welded to the support plates 16 and 18. The shaft 12 may be hollow to save weight.

Figure 2:
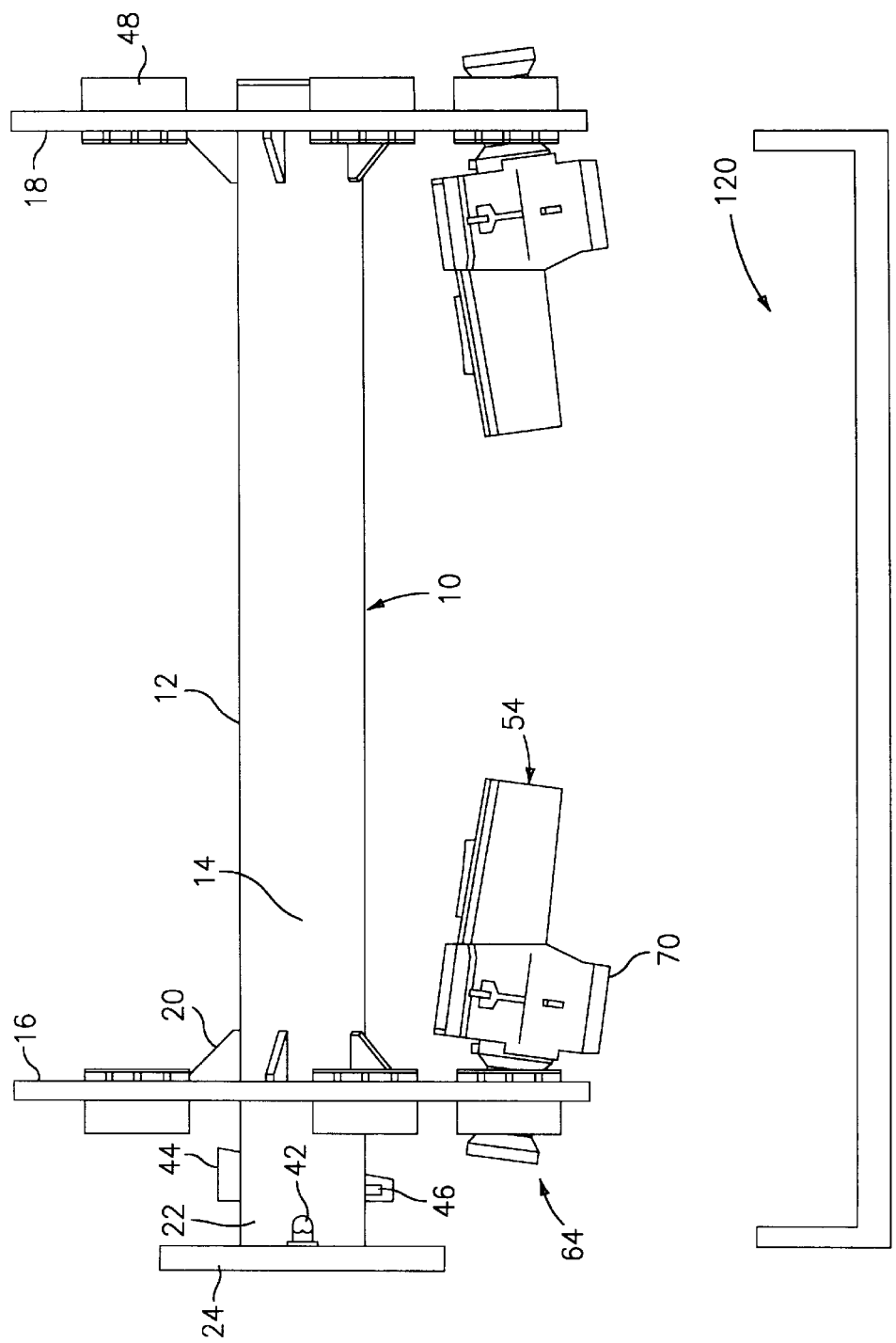
FIG. 2 is a side view of the modular coating fixture of FIG. 1.
Figure 3:
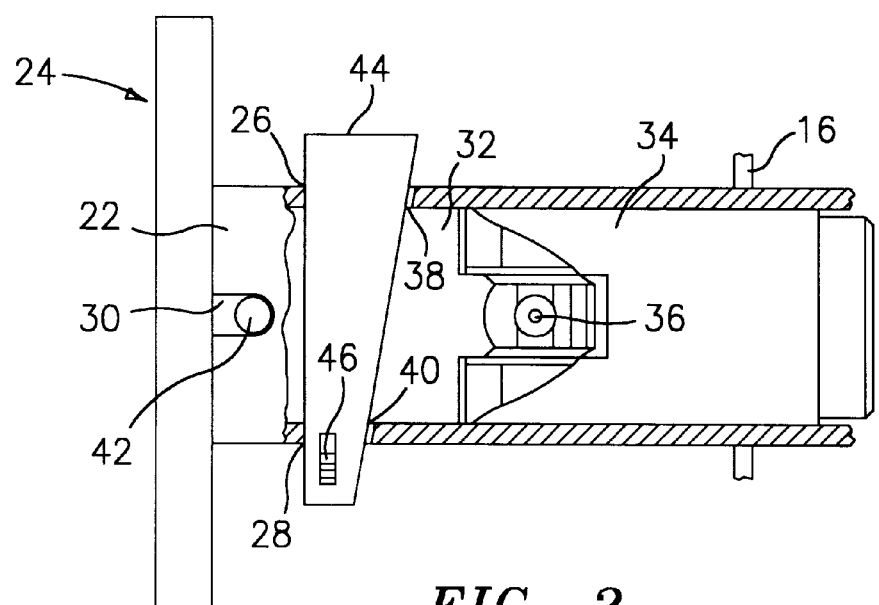
FIG. 3 is a top view in partial cross-section of a connecting member used to connect the fixture of FIG. 1 to a drive shaft.

As shown in FIG. 2, cylindrical mounting column 22 protrudes from one end of the fixture 10. The mounting column 22 may be an extension of shaft 12 or a separate component welded to one of the support plates 16 and 18. The mounting column 22 is hollow and designed to receive a mating portion 34 of a connecting member 24 affixed to a drive system (not shown) for rotating the fixture 10 about its longitudinal axis 14. Referring now to FIG. 3, the mounting column 22 is preferably provided with two aligned, opposed slots 26 and 28. Additionally, it has a keyway 30 adjacent one end thereof.

Figure 4:
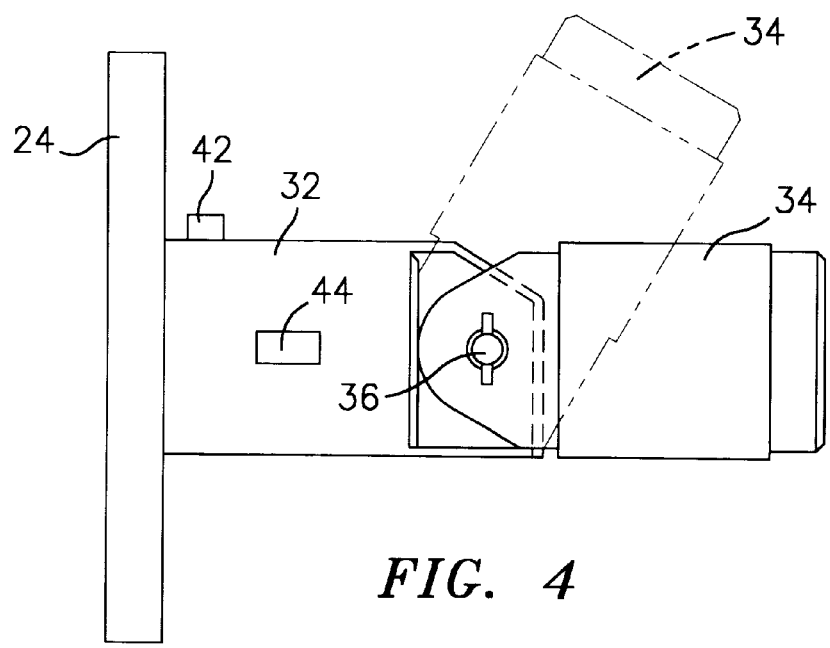
FIG. 4 is a side view of the connecting member of FIG. 3 showing it in a fixture receiving/unloading position.

Referring now to FIGS. 3 and 4, the connecting member 24 includes a base portion 32 and a shaft portion 34 which is joined to the base portion 32 by a pivot 36. As shown in FIG. 4, the pivot 36 allows the shaft portion 34 to be moved relative to the base portion 32 so as to facilitate installation and removal of the fixture 10. The shaft portion 34 is dimensioned to fit within the hollow mounting column 22. The base portion 32 is provided with two slots 38 and 40 for mating with the slots 26 and 28 in the column 22. Furthermore, the base portion 32 has a key 42 which fits into the keyway 30 to ensure that the slots 38 and 40 are properly aligned with the slots 26 and 28.

To secure the fixture 10 to the connecting member 24, a wedge 44 is inserted through the slots 26, 38, 40 and 28. The wedge 44 preferably has an eyelet 46 adjacent one end for receiving a wire (not shown) to lock it in place.

Referring now to FIG. 1, a plurality of bushings 48 are radially spaced about each of the support plates 16 and 18. The number of bushings 48 in each support plate and the spacing of the bushings 48 relative to the shaft 12 are determined by the type of workpiece or workpieces to be coated. As shown in FIG. 5, the bushings 48 are formed by a hollow cylindrically shaped sleeve member 50 welded on two sides to the respective support plate 16 or 18. The interior bore 52 of the sleeve member may have any desired diameter. For reasons to be discussed hereinafter, the surfaces of the bore 52 are preferably roughened.

During the coating operation, it is necessary for the workpiece 54 being coated, to rotate about its longitudinal axis 122 so that multiple surfaces of the workpiece, such as the leading edge 56 and the opposed flow surfaces 58 and 60 are substantially uniformly coated. It is also desirable in many applications for a surface 62 substantially perpendicular to the flow surfaces 58 and 60 to be coated as well. In line of sight coating processes, such as electron beam physical vapor deposition processes, it is necessary to tilt the workpiece 54 towards the source of coating material 120 as the workpiece 54 is rotated about its longitudinal axis 122 in order to coat the surface 62. In the present invention, the desired coating of the surface 62 is obtained by using a spindle arrangement 64 with each bushing 48 to tilt the workpiece towards the source of the coating material.

Referring now to FIG. 6, the spindle arrangement 64 preferably comprises a pin 66 having a shaft portion 67 and an enlarged head portion 68, which head portion abuts against one end of the bushing 48 with which it is associated. The shaft portion 67 has a roughened surface and an exterior diameter which is smaller than the interior diameter of the bore 52 so as to allow the pin 66 to tilt relative to the bushing 48. The diameter of the shaft portion 67 along with the length of the sleeve 50 and the diameter of bore 52 determine the degree of tilt. Obviously, the degree of tilt must not be such that the workpiece 54 contacts the shaft 12 during coating. The pin 66 further includes a reduced shaft portion 69 which fits into a cup-shaped member 72 which will be described hereinafter.

The workpiece 54 to be coated is attached to the spindle arrangement 64. As shown in FIG. 6, the workpiece 54 is attached to the pin 66 via a workpiece retaining device 70 and a cup shaped member 72 attached to one end of the retaining device. The cup-shaped member 72 may be attached to the retaining device 70 by any suitable means known in the art such as by welding. The cup-shaped member 72 includes two opposed openings 74 and 76 for mating with a slot 78 in an end of the shaft portion 69. A pin or wedge-shaped member 80 is inserted through the opening 74, through the slot 78, and through the opening 76 to secure the cup-shaped member 72 to the pin 66. The pin or wedge-shaped member 80 is designed to securely affix the retaining device 70 to the spindle arrangement 64.

Figure 7:
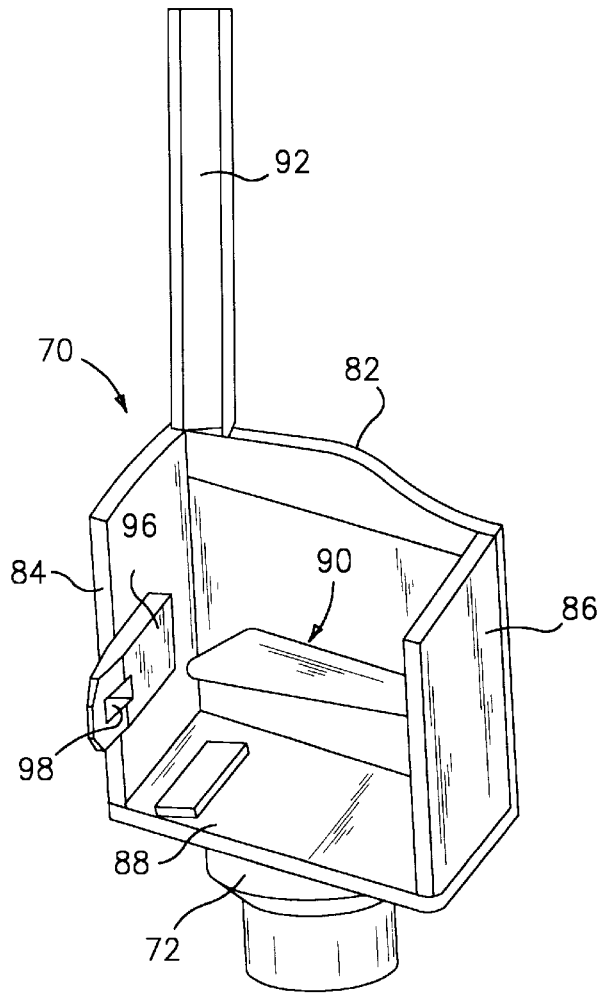
FIG. 7 is a front view of a workpiece retaining device used with the modular fixture of the present invention.

The retaining device 70, as shown in FIG. 7, is an open-faced and open-ended structure which includes a back wall 82 and two side walls 84 and 86 joined thereto. The retaining device 70 further includes a bottom wall 88 which connects the two side walls 84 and 86. The workpiece 54 to be coated is placed within the retaining device 70 via the open face defined by the side walls 84 and 86, the back wall 82 and the bottom wall 88. Once positioned within the retaining device 70, the portion of the workpiece 54 to be coated extends through the open end located opposite the bottom wall 88. Where the workpiece 54 has a surface 62 such as a platform to be coated, the side walls 84 and 86 and the back wall 82 are shaped and/or configured to conform to the shape of the surface 62. If desired, the back wall 82 may be provided with a support plate 90 for holding the workpiece 54 in a desired position. The support plate 90 preferably cooperates with a feature on the workpiece 54 such as a ribbed portion or a notch (not shown), to hold it in the desired position.

A masking device 92 may be mounted to the back wall 82 and/or to a side wall 84 to prevent certain portions of the workpiece 54, such as a trailing edge 94, from being coated. The masking device 92 may have any suitable shape and length. For example, it may be L-shaped. Of course, the shape of the masking device 92 will depend on the shape of that portion of the workpiece 54 not to be coated.

A tongue member 96 is secured, such as by welding, to the interior side of side wall 84. The tongue member 96 has a slot 98 cut therein and serves to secure a cover 100 to the retaining device 70.

Figure 8:
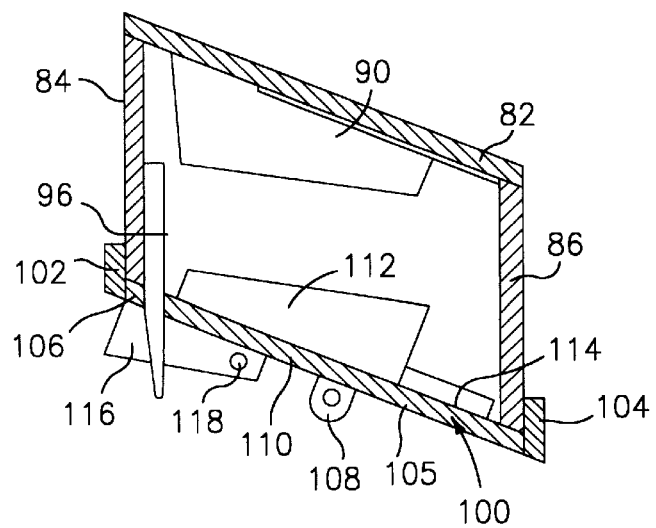
FIG. 8 is a sectional view of the workpiece retaining device of FIG. 7 showing a cover secured in place.

Referring now to FIG. 8, the cover 100 has side portions 102 and 104 which overlap the side walls 84 and 86 when the cover is seated on the retaining device 70 and connecting portion 105 extending therebetween. The connecting portion 105 of the cover 100 includes a slot 106 through which the tongue member 96 protrudes. Still further, the connecting portion 105 of the cover 100 has an eyelet 108 attached to its exterior surface 110 and an optional support member 112 mounted to its interior surface 114. The support member 112 cooperates with a portion of the workpiece 54 to maintain the workpiece in a desired position within the retaining device 70.

A wedge 116 is provided to secure the cover 100 to the retaining device 70. As shown in FIG. 8, the wedge 116 has a bore 118 adjacent one end thereof. When the wedge is placed into its securing position adjacent the exterior surface 114 of the cover, a wire (not shown) is passed through the bore 118 and the eyelet 108 so as to secure the wedge 116 in its proper position. FIG. 9 illustrates a workpiece secured within the retaining device 70.

The various components of the modular fixture 10 such as the shaft 12, the support plates 16 and 18, the mounting column 22, the retaining device 70, the bushings 48, and the spindle arrangement 64 may be formed from any suitable material known in the art. Preferably, they are formed from a material known as HASTALLOY-X.

The modular fixture 10 of the present invention is used in the following manner. First, a plurality of workpieces 54 to be coated are placed within the retaining devices 70. After the covers 100 have been secured in place, the modular fixture 10, with the workpieces 54 in place, is placed onto the connecting member 24 joined to a drive system (not shown). As previously described, the fixture 10 is secured to the connecting member 24 via the aligned slots 26, 28, 38 and 40 and the wedge 44 which passes through the slots. The fixture 10 after being secured to the connecting member 24 is transported into a coating chamber, such as an electron beam physical vapor deposition chamber, in which a coating material to be vaporized in a known manner is located. The actual technique for causing the coating material to be vaporized does not form part of the present invention. The fixture 10 may be used with any number of different techniques.

During the coating operation, the modular fixture 10 is rotated about its longitudinal axis 14 by the drive system (not shown). As the fixture 10 is rotated, gravity and the presence of friction between each bushing and cooperating spindle arrangement causes each retaining device 70 and each workpiece 54 to rotate about the workpiece longitudinal axis 122 so that the opposed flow surfaces 58 and 60 and the leading edge 56 of each workpiece are coated. Additionally, the bushing 48 and spindle arrangement 64 allow each workpiece 54 to tilt so that each of the axes 122 intersects the longitudinal axis 14 and towards the source of the coating material 120. As a result, those surfaces perpendicular to the flow surfaces 58 and 60, such as the platform surface 62, are exposed to the vaporized coating material and are also coated. After the coating operation has been completed, the modular fixture 10 with the workpieces 54 is removed from the coating chamber and a new fixture 10 with new workpieces 54 to be coated is installed.

It can be seen from the foregoing description that the modular coating fixture of the present invention provides numerous commercial advantages. Most notably, the fixture allows the simultaneous coating of multiple workpieces. The fixture further allows easy placement of the workpieces therein and easy removal of the workpieces therefrom. Still further, the workpieces may be placed in the fixture and removed from the fixture while another set of workpieces are being coated on yet another fixture. Additionally, the fixture of the present invention is easier to use than prior art systems.

The fixture of the present invention has particular utility in coating airfoils such as turbine blades and vanes. By using the fixture of the present invention, it is possible to coat a platform portion of the turbine blade or vane as well as the leading edge and both flow surfaces.

The fixture of the present invention is relatively simple in design when compared to expensive gear driven longitudinally and transverse act as part manipulation systems. Further, it can produce a close to uniform coating thickness and excellent coating structure. Due to the simplistic design of the fixture of the present invention, coating can be accomplished at a much lower cost.

It is apparent that there has been provided in accordance with the present invention a modular coating fixture which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modification, and variations as fall within the spirit and broad scope of the appended claims.

What is claimed is:

1. An apparatus for coating a workpiece comprising:

a modular fixture for coating a workpiece, said fixture having a rotational axis and said workpiece having a longitudinal axis;

said modular fixture including a longitudinally extending shaft, a support plate attached thereto and means for supporting said workpiece so as to allow said workpiece to tilt at an angle relative to said rotational axis towards a source of coating material during the coating operation;

said supporting means comprising a bushing arrangement within said support plate and a cooperating spindle arrangement to which said workpiece is attached; and means for rotating said modular fixture and thereby causing relative motion between said spindle arrangement and said bushing arrangement and rotation of said workpiece about said longitudinal axis.

2. The apparatus of claim 1 further comprising:

said modular fixture including a longitudinally extending shaft and a support plate attached thereto; and said supporting means comprising a bushing arrangement within said support plate and a cooperating spindle arrangement to which said workpiece is attached.

3. The apparatus of claim 1 further comprising:

said bushing arrangement comprising a hollow sleeve member having an interior bore; and said spindle arrangement comprising a pin having an enlarged end portion for contacting one end of said sleeve member and a shaft portion attached to said enlarged end portion, said shaft portion having an outer diameter less than the diameter of said bore.

4. The apparatus of claim 3 further comprising:

said sleeve member being welded to said support plate.

5. An apparatus for coating a workpiece comprising:

a modular fixture for coating a workpiece;

said modular fixture including a longitudinally extending shaft, a support plate attached thereto and means for supporting said workpiece so as to allow said workpiece to simultaneously rotate about its longitudinal axis and tilt towards a source of coating material during the coating operation;

said supporting means comprising a bushing arrangement within said support plate and a cooperating spindle arrangement to which said workpiece is attached;

said bushing arrangement comprising a hollow sleeve member having an interior bore;

said spindle arrangement comprising a pin having an enlarged end portion for contacting one end of said sleeve member and a shaft portion attached to said enlarged end portion, said shaft portion having an outer diameter less than the diameter of said bore; and said bore and shaft portion having roughened surfaces for creating friction which allows said workpiece to roll during rotation of said fixture.

6. The apparatus of claim 3 further comprising:

a workpiece retaining device connected to said shaft portion of said spindle arrangement.

7. An apparatus for coating a workpiece comprising:

a modular fixture for coating a workpiece;

said modular fixture including a longitudinally extending shaft, a support plate attached thereto and means for supporting said workpiece so as to allow said workpiece to simultaneously rotate about its longitudinal axis and tilt towards a source of coating material during the coating operation;

said supporting means comprising a bushing arrangement within said support plate and a cooperating spindle arrangement to which said workpiece is attached;

said bushing arrangement comprising a hollow sleeve member having an interior bore;

said spindle arrangement comprising a pin having an enlarged end portion for contacting one end of said sleeve member and a shaft portion attached to said enlarged end portion, said shaft portion having an outer diameter less than the diameter of said bore;

a workpiece retaining device connected to said shaft portion of said spindle arrangement; and said retaining device having a cup-shaped connector at one end;

said cup-shaped connector having two opposed slots;

said shaft portion having at least one slot for mating with said two opposed connector slots; and means for securing said connector to said shaft portion.

8. The apparatus of claim 7 wherein said securing means comprising a wedge-shaped member passing through said connector slots and said at least one shaft portion slot.

9. An apparatus for coating a workpiece comprising:

a modular fixture for coating a workpiece;

said modular fixture including a longitudinally extending shaft, a support plate attached thereto and means for supporting said workpiece so as to allow said workpiece to simultaneously rotate about its longitudinal axis and tilt towards a source of coating material during the coating operation;

said supporting means comprising a bushing arrangement within said support plate and a cooperating spindle arrangement to which said workpiece is attached;

said bushing arrangement comprising a hollow sleeve member having an interior bore;

said spindle arrangement comprising a pin having an enlarged end portion for contacting one end of said sleeve member and a shaft portion attached to said enlarged end portion, said shaft portion having an outer diameter less than the diameter of said bore;

a workpiece retaining device connected to said shaft portion of said spindle arrangement; and said workpiece retaining device comprising a workpiece holding device having a first wall and two side walls extending from said first wall, said side walls and said first wall defining an opening for receiving said workpiece and a cover for closing said opening after said workpiece has been placed within said holding device.

10. The apparatus of claim 9 further comprising:

a tongue-like member attached to and protruding from one of said side walls, said tongue-like member having a slot therein; and said cover having a slot through which said tongue-like member passes when said cover closes said opening.

11. The apparatus of claim 10 further comprising:

a wedge member for securing said cover to said workpiece holding device; and said wedge member passing through said slot in said tongue like member and contacting portions of the exterior surface of said cover.

12. The apparatus of claim 9 further comprising:

means for positioning said workpiece within said workpiece holding device.

13. The apparatus of claim 12 wherein said positioning means comprises a positioning member attached to the first wall, said positioning member cooperating with a portion of said workpiece.

14. The apparatus of claim 12 wherein said positioning means comprises a positioning member extending between said first wall and one of said side walls, said positioning member cooperating with a portion of said workpiece.

15. The apparatus of claim 9 further comprising:

a masking device attached to said workpiece holding device; and said masking device extending over a portion of said workpiece not to be coated during the coating operation.

16. The apparatus of claim 15 wherein said masking device covers a trailing edge portion of said workpiece.

17. The apparatus of claim 1 further comprising:

means for securing said modular fixture to a means for rotating said modular fixture about its longitudinal axis.

18. An apparatus for coating a workpiece comprising:

a modular fixture for coating a workpiece;

said modular fixture including a longitudinally extending shaft, a support plate attached thereto and means for supporting said workpiece so as to allow said workpiece to simultaneously rotate about its longitudinal axis and tilt towards a source of coating material during the coating operation;

said supporting means comprising a bushing arrangement within said support plate and a cooperating spindle arrangement to which said workpiece is attached;

means for securing said modular fixture to a means for rotating said modular fixture about its longitudinal axis; and said securing means comprising a cylindrical mounting column protruding from one end of said modular fixture, said cylindrical mounting column having two opposed slots, a drive shaft connecting member having a shaft portion which mates with said cylindrical mounting column and a base portion, said base portion having at least one slot therein for mating with said two opposed slots, and means passing through said two opposed slots and said at least one slot in said base portion for securing said modular fixture to said connecting member.

19. The apparatus of claim 18 further comprising said connecting member having a pivot for allowing said modular fixture to move relative to said base portion.

20. A modular apparatus for simultaneously coating a plurality of workpieces which comprises:

a modular fixture having a rotational axis and means for supporting a plurality of workpieces so that each of said workpieces rotates about its respective longitudinal axis during a coating cycle and simultaneously tilts along an axis at an angle to the rotational axis of said modular fixture towards a source of coating material at all times during said coating cycle so that desired portions of each workpiece are coated by said coating material.

21. A modular apparatus for simultaneously coating a plurality of workpieces which comprises:

a modular fixture having means for supporting a plurality of workpieces so that each of said workpieces rotates about its respective longitudinal axis during a coating cycle and simultaneously tilts towards a source of coating material at all times during said coating cycle so that desired portions of each workpiece are coated by said coating material; and said modular fixture having a longitudinally extending member and two support plates respectively attached to first and second ends of said longitudinally extending member, said support plates being separated by a desired distance.

22. The modular apparatus of claim 21 further comprising:

said supporting means comprising a plurality of bushings affixed to each of said support plates; and a plurality of cooperating spindle arrangements to which said workpieces are attached.

23. The modular apparatus of claim 22 further comprising:

said spindle arrangements being dimensioned so as to allow said spindle arrangements to roll relative to said bushings while said modular fixture is rotated during a coating cycle.

24. The modular apparatus of claim 23 further comprising:

means for holding a workpiece attached to each of said spindle arrangements.

25. The modular apparatus of claim 24 further comprising:

each of said spindle arrangements including an enlarged head portion and a shaft portion passing through a bore in a respective bushing.

26. The modular apparatus of claim 25 further comprising:

each said workpiece holding means including a connector attached to one end; and means for securing said connector to one of said spindle shaft portions.

27. The modular apparatus of claim 24 further comprising:

each said workpiece holding means including a first wall and two side walls extending from said first wall, said side walls and said first wall defining an opening for receiving said workpiece; and a cover for closing said opening after said workpiece has been placed within said holding means.

28. The apparatus of claim 27 further comprising:

a tongue-like member attached to and protruding from one of said side walls, said tongue-like member having a slot therein; and said cover having a slot through which said tongue-like member passes when said cover closes said opening.

29. The apparatus of claim 28 further comprising:

a wedge member for securing said cover to said workpiece holding means; and said wedge member passing through said slot in said tongue like member and contacting portions of the exterior surface of said cover.

30. The apparatus of claim 27 further comprising:

means for positioning said workpiece within said workpiece holding means.

31. The apparatus of claim 30 wherein said positioning means comprises a member attached to the first wall, said member cooperating with a portion of said workpiece.

32. The apparatus of claim 30 wherein said positioning means comprises a member extending between said first wall and one of said side walls, said member cooperating with a portion of said workpiece.

33. The apparatus of claim 24 further comprising:

a masking device attached to said workpiece holding means; and said masking device extending over a portion of said workpiece not to be coated during the coating operation.

34. The apparatus of claim 33 wherein said masking device covers a trailing edge portion of said workpiece.

35. The apparatus of claim 20 further comprising:

said workpieces each comprise an airfoil having two opposed surfaces, a leading edge, a trailing edge, and a platform portion; and said simultaneous rotation and tilting of said workpieces allowing each said airfoil to be coated on said two opposed surfaces, said leading edge and said platform portion and said masking devices substantially preventing the coating of said trailing edge portion of each said airfoil.

36. The apparatus of claim 20 further comprising:

means for securing said modular fixture to a drive system for rotating said modular fixture about its longitudinal axis during a coating cycle.

37. The apparatus of claim 36 wherein said securing means comprises a cylindrical column member protruding from one end of said modular fixture and a connector element attached to said drive system.

38. The apparatus of claim 37 wherein said connector element has a base portion and a pivot for allowing said modular fixture to be positioned at an angle relative to said base portion.

39. The apparatus of claim 36 further comprising:

said connector element having at least one slot;

said cylindrical column member having two opposed slots; and a wedge member for securing said cylindrical member to said connector element.

40. A modular apparatus for simultaneously coating a plurality of workpieces which comprises:

a modular fixture having means for supporting a plurality of workpieces so that each of said workpieces rotates about its respective longitudinal axis during a coating cycle and simultaneously tilts towards a source of coating material at all times during said coating cycle so that desired portions of each workpiece are coated by said coating material;

said modular fixture having at least one support plate;

said supporting means comprising a plurality of bushings mounted within said at least one support plate and a plurality of cooperating spindles arrangements to which said workpieces are attached; and said spindle arrangements being dimensioned so as to allow said spindle arrangements to roll relative to said bushings while said modular fixture is rotated during a coating cycle.

* * * * *